United States Patent
Zhang

(10) Patent No.: US 8,143,532 B2
(45) Date of Patent: Mar. 27, 2012

(54) BARRIER LAYER TO PREVENT CONDUCTIVE ANODIC FILAMENTS

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 513 days.

(21) Appl. No.: 12/366,017

(22) Filed: Feb. 5, 2009

(65) Prior Publication Data
US 2010/0193229 A1 Aug. 5, 2010

(51) Int. Cl.
*H05K 1/11* (2006.01)
(52) U.S. Cl. ........................................... 174/260
(58) Field of Classification Search ............. 174/260, 174/262, 266
See application file for complete search history.

(56) References Cited

U.S. PATENT DOCUMENTS

| | | | |
|---|---|---|---|
| 5,052,103 A | 10/1991 | Saitou | |
| 5,246,817 A | 9/1993 | Shipley, Jr. | |
| 5,576,052 A | 11/1996 | Arledge et al. | |
| 5,976,974 A | 11/1999 | Fischer et al. | |
| 6,820,330 B1 | 11/2004 | Haba | |
| 7,416,996 B2 | 8/2008 | Japp et al. | |
| 7,800,002 B2 * | 9/2010 | Chujo et al. | 174/263 |
| 2003/0038344 A1 * | 2/2003 | Palmer et al. | 257/621 |
| 2005/0150683 A1 * | 7/2005 | Farnworth et al. | 174/255 |
| 2005/0266214 A1 | 12/2005 | Usui et al. | |
| 2008/0164057 A1 | 7/2008 | Mori et al. | |

FOREIGN PATENT DOCUMENTS
EP 1 653 789 A1 5/2006

OTHER PUBLICATIONS

Yung, Winco K.C., "Conductive Anodic Filament: Mechanisms and Affecting Factors," *HKPAC Journal*, 2006, Issue 21, pp. 1-6, available from the Hong Kong Printed Circuit Association, Room 2107, Corporation Park, 11 on Lai Street, Shatin, N.T., Hong Kong, www.hkpca.org.

Karavakis, Konstantine, "Conductive Anodic Filament (CAF)," *MEPTEC Report*, Quarter 4, 2004, available from the MicroElectronics Packaging and Test Engineering Council (MEPTEC), P.O. Box 222, Medicine Park, Oklahoma 73557, www.meptec.org.

Uusluoto, Teija et al., "Metallization of microvias by sputter-deposition," *Microelectronics Reliability*, Oct. 20, 2003, vol. 44, No. 4, pp. 587-593, Elsevier Ltd., Burlington, Massachusetts, USA.

* cited by examiner

*Primary Examiner* — Chau Nguyen
(74) *Attorney, Agent, or Firm* — Scott Hewett; LeRoy D. Maunu; Lois D. Cartier

(57) ABSTRACT

A through hole is formed in a circuit board that has fibers dispersed in a polymer matrix. Copper is sputtered within the through hole to form a sufficiently conductive layer for electrolytic plating over the sputtered copper layer.

15 Claims, 4 Drawing Sheets

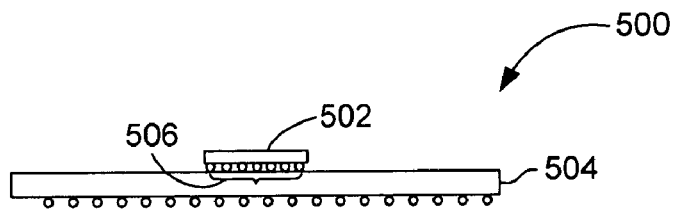
FIG. 5
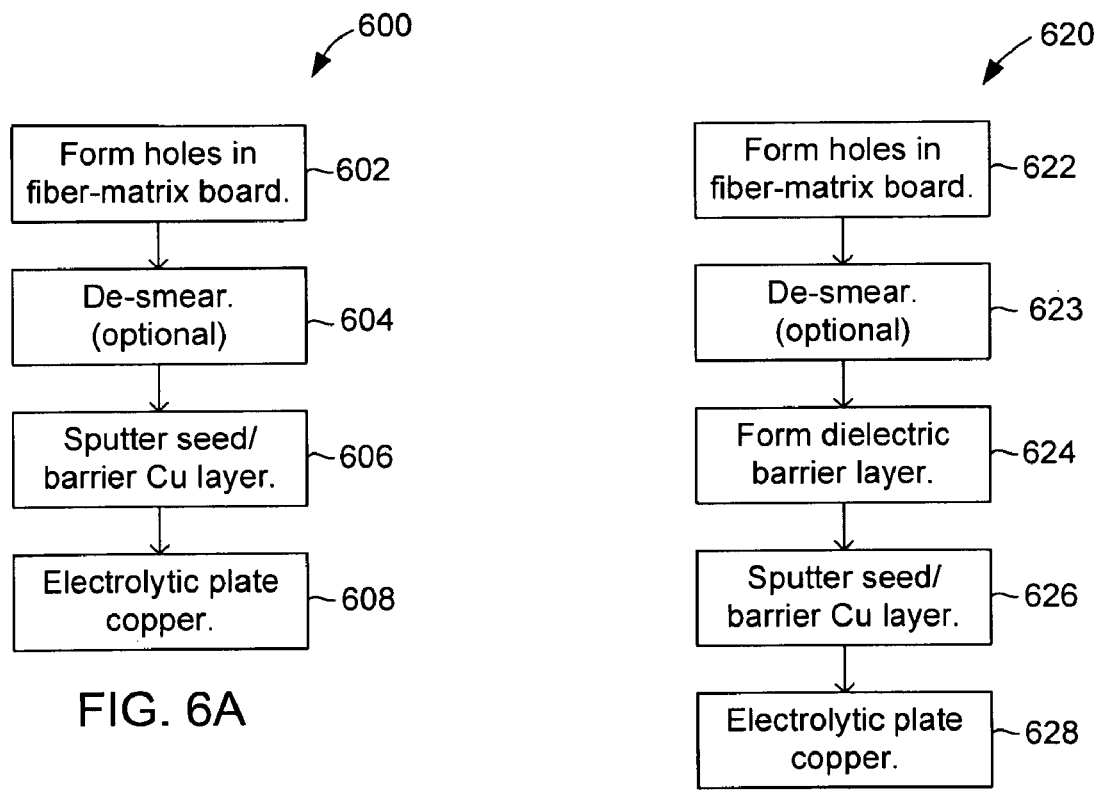
FIG. 6A
FIG. 6B

BARRIER LAYER TO PREVENT CONDUCTIVE ANODIC FILAMENTS

FIELD OF THE INVENTION

This invention relates generally to techniques for fabricating integrated circuits, and more particularly to techniques for metal plating of substrates and printed circuit boards.

BACKGROUND OF THE INVENTION

Many integrated circuits ("ICs") and circuit assemblies ("circuit boards") use fiber-reinforced substrate material. Glass fibers or fibers of other materials are mixed in polymer matrix, such as an epoxy matrix, to form a sheet of fiber-reinforced material that is processed into a substrate for mounting an IC, a package base, a printed circuit board ("PCB") (also known as a printed wiring board), adaptor, or interposer. For purposes of convenient discussion, such patterned fiber-reinforced polymer components will be referred to as "PCBs", regardless of eventual application.

Many technologies have been developed for fabricating PCBs, and for fabricating the various features found on a PCB, such as traces, vias, and through-holes. The techniques suitable for producing a PCB for a particular application depend on various performance requirements, such as pitch. Pitch is basically how close together conductive vias (generally, solid conductive structures extending from one surface of the substrate to the opposite surface of the substrate) or plated through-holes ("PTHs", which are generally similar to conductive vias except that an outer wall of the plated through-hole is conductive and a hole extends from one surface of the substrate to the opposite surface). For PCBs having a coarse pitch, techniques such as mechanical drilling and solder-paste screening are acceptable. For PCBs having a fine (narrow) pitch, other techniques, such as laser drilling and electroless copper ("e-Cu") plating techniques are used. Electroless copper plating can be used to plate non-conductive surfaces, such as the substrate material of a PCB; however, electroless copper plating uses strong ionic solutions.

Conductive anodic filaments ("CAFs") occur when ions, particularly residual ions from the electroless plating process, travel along a fiber to form a conductive path. Generally, the fiber or fiber-polymer interface provides an electrolytic pathway for the transportation of reaction products that occurs in the presence of humidity. A voltage applied between conductive features (i.e., and anode feature and a cathode feature) promotes copper dissolution at the anode and copper migration toward the cathode until a conductive path is formed. CAFs are not a major problem on coarse-pitch PCBs, but increasingly appears on fine-pitch PCBs as internal surfaces of the PCBs (i.e., via walls or plated through-hole walls) are fabricated closer together. CAFs occur when copper ions used in the standard e-Cu plating process travel along a fiber (e.g., a glass fiber) that intersects an internal surface of the fiber-reinforced polymer composite.

CAFs are enhanced by high humidity during storage or use, by high voltage gradient between anode and cathode, by certain soldering flux ingredients, by mechanical hole drilling (which can induce fiber-matrix separation), multiple thermal cycles during processing, and by higher processing temperatures associated with lead-free solders. CAFs are particularly likely to occur if the fiber separates from the polymer matrix, even slightly, to allow copper ion migration and exchange along the length of the fiber. If a conductive path is established from one internal surface (i.e., one conductive via or plated through hole) to another, an electrical short is established). Whether this occurs depends on many factors, such as the distance between adjacent internal surfaces, the integrity of the fiber-polymer interface, and the processing parameters of the e-Cu process, such as plating time (target copper thickness).

Many efforts have been made to reduce CAFs. One approach has focused on reducing the separation between the fiber and polymer matrix. Another approach has been to tighten the drilling process control, since adjacent holes drilled at the edge of the drilling tolerance specification are closer together, and hence more likely to short together due to CAF. Another approach has been to utilize laser drilling, which is less likely to induce fiber-matrix separation than mechanical drilling. Another approach has been to modify the parameters of the e-Cu process to reduce the chance that a fiber will be able to form a short from one end to the other during copper plating. All of these approaches tighten the allowable materials or process window(s) and increase cost. CAFs remain a problem, and in-line monitoring is typically done on a sample basis, allowing some components with CAFs to proceed to the next assembly. Even if the in-line monitoring identifies bad parts, it results in scrapped PCBs.

FIG. 1 is a side view of a portion of a conventional PCB 100 with plated through holes 102, 104 illustrating a CAF 106. The plated through holes 102, 104 extend from a first major surface 108 to a second major surface 110 of the PCB 100, which is a fiber-reinforced polymer composite material, such as glass-fiber reinforced epoxy. Glass fibers 112, 114 are shown in the central portion 116 of the PCB 100, but are not shown in the side portions 118, 120 of the PCB for simplicity and clarity of illustration, although fibers are generally present throughout the PCB composite material.

A layer of copper has been formed using an e-Cu plating process to create conductive cylinders 122, 124 lining the interior surface of the PTHs 102, 104. During the plating process, copper ions migrate along a fiber 114 to form conductive portions (i.e., copper-plated portions) 126, 128 of the fiber. The conductive portions of the fiber can extend from both ends, and when they merge, a CAF 106 is formed that electrically connects (shorts) the first PTH 102 to the second PTH 104.

FIG. 2 is a side view of a portion of a conventional PCB 200 with conductive via ("blind via") 202 illustrating a CAF 206. The CAF 206 extends from a first blind via 202 through a fiber-matrix portion of the PCB 204 to a second blind via 208, which forms an electrical short between the blind vias 202, 208.

Techniques for fabricating PCBs without CAFs that avoid the limitations of the prior art are desired.

SUMMARY OF THE INVENTION

A through hole is formed in a circuit board that has fibers dispersed in a polymer matrix. Copper is sputtered within the through hole to form a sufficiently conductive layer for electrolytic plating over the sputtered copper layer.

BRIEF DESCRIPTION OF THE DRAWINGS

FIG. 5 is a side view of an assembly of an IC on a PCB according to an embodiment.

FIG. 6A is a flow chart of a process of manufacturing a PCB according to an embodiment.

FIG. 6B is flow chart of a process of manufacturing a PCB according to an alternative embodiment.

DETAILED DESCRIPTION

Figure 1:
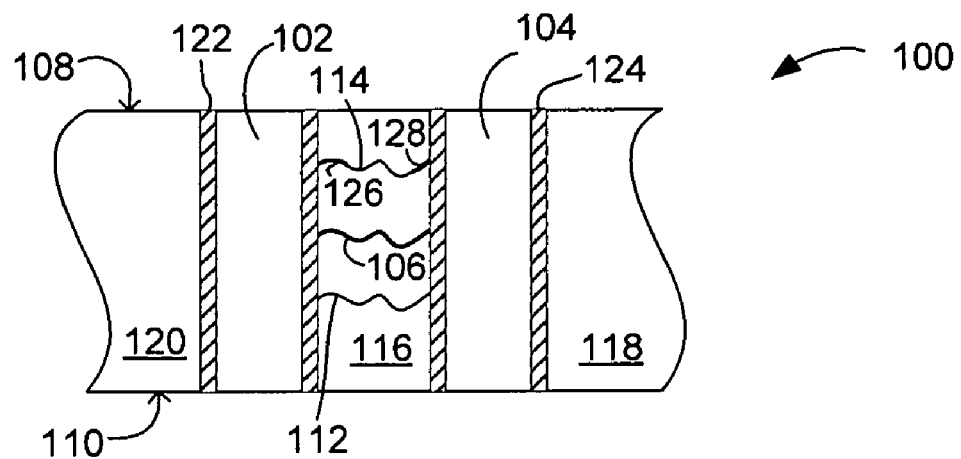
FIG. 1 is a side view of a portion of a conventional PCB with plated through holes illustrating a CAF.
Figure 2:
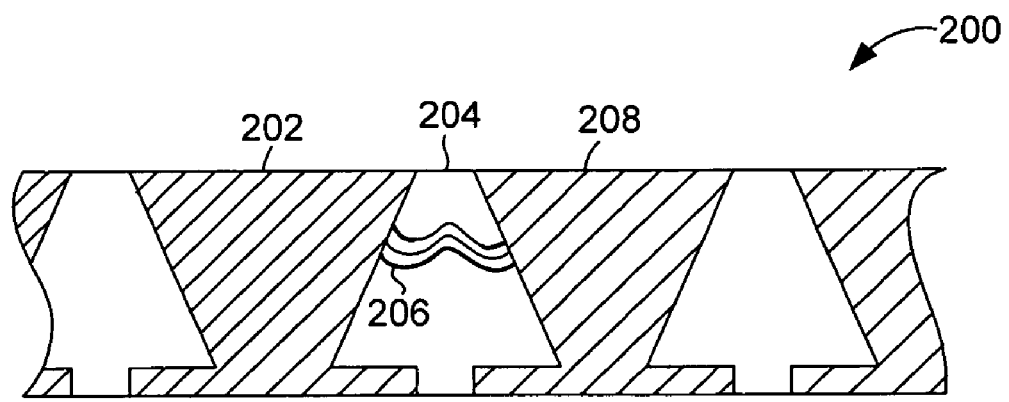
FIG. 2 is a side view of a portion of a conventional PCB with conductive via illustrating a CAF.
Figure 3A:
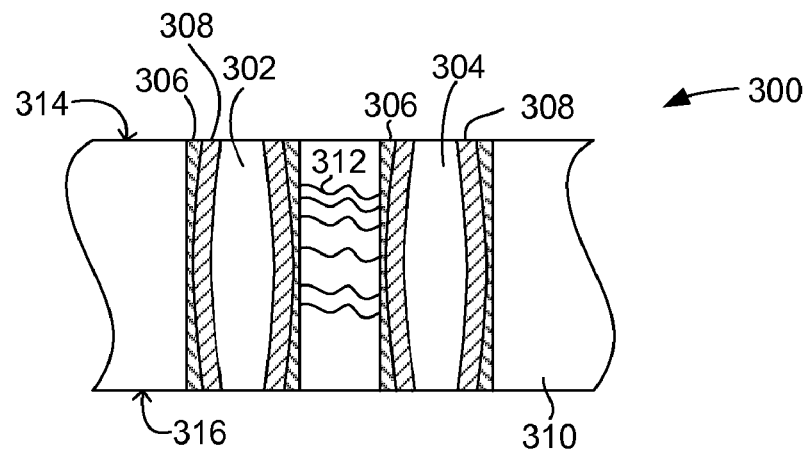
FIG. 3A is a side view of a portion a PCB with plated through holes according to an embodiment.

FIG. 3A is a side view of a portion a PCB 300 with plated through holes 302, 304 according to an embodiment. The plated through hole 302 has a sputtered copper layer 306 and a second copper layer 308 formed by an electrolytic plating process. The sputtered copper layer 306 forms a barrier layer against ion intrusion into the fiber-matrix portion ("board") 310. In some embodiments, the sputtered copper layer 306 seals the ends of the fibers 312 where they emerge at the hole wall, and forms a conductive surface suitable for electrolytic copper plating. The combination of a conductive sputtered copper ("seed") layer and an electrolytic copper plated layer avoids ionic contamination associated with electroless copper plating and CAF formation in conventional PCBs, while providing a conductive through hole.

In a particular embodiment, the sputtered copper layer 306 is sufficiently thick to provide a conductive surface suitable for electrolytic copper plating. The thickness of the sputtered copper layer is exaggerated for purposes of illustration. In some embodiments, the sputtered copper layer may not completely seal the ends of the fibers, or not seal the ends of the fibers over the entire surface of the plated through hole; however, the chance of forming a CAF is reduced even when complete sealing is not obtained. In a particular embodiment, the sputtered copper layer is at least about 1 micron thick.

In a particular embodiment, the sputtered copper layer is formed by sputtering from both sides. For example, the copper seed layer is formed by sputtering from one side 314, and then sputtering from the opposite side 316 (or concurrently sputtering from both sides). The sputtered copper layer typically tapers on the through-hole wall, as more material is generally deposited nearer the planar surfaces of the board then in the middle of the board. In a particular embodiment, the PCB 300 is about 400 microns to about 600 microns thick, and sputtering is done from each side of the board to achieve a minimum thickness of sputtered copper within the inner diameter of the through hole of not less than one micron. In an alternative embodiment, the sputtered copper layer is sufficiently thick (i.e., electrically conductive) that the plated copper layer may be omitted.

Figure 3B:
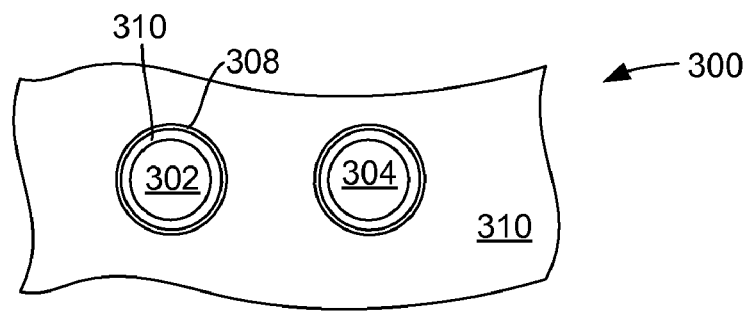
FIG. 3B is a plan view of the portion of the PCB illustrated in FIG. 3A.

FIG. 3B is a plan view of the portion of the PCB 300 illustrated in FIG. 3A. The plated through holes 302, 304 extend through the board 310. The sputtered copper layer 308 and plated copper layer 310 are seen on-end. In some embodiments, conductive traces (not shown) extend from plated through holes to form electrical connections with other elements on the PCB 300. In some embodiments, the plated through holes are filled with solder, conductive polymer (e.g., conductive epoxy), or dielectric polymer. Sputtered copper may be excluded from areas that are not desired to be plated by using any of several masking techniques, such as using a lift-off masking technique.

Figure 3C:
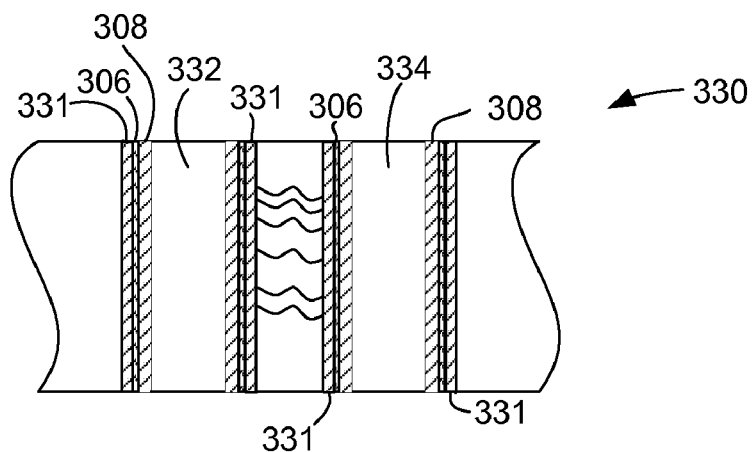
FIG. 3C is a side view of portion of a PCB with plated through holes according to another embodiment.

FIG. 3C is a side view of portion of a PCB 330 with plated through holes according to another embodiment. A dielectric barrier layer 331 is formed on the sidewalls of the plated through holes 332, 334. The dielectric barrier layer 331 forms an additional barrier against ionic migration along fibers exposed at the sidewalls of the holes. Using the dielectric barrier layer 331 in combination with the sputtered copper layer 306 allows greater processing variation (e.g., sputtered layer thickness) and greater material selection (e.g., hollow-fiber boards or thicker boards). The dielectric barrier layer 331 is a thin layer of epoxy or polyimide, for example, and is formed by dipping or other suitable application method, and further protects against migration of ions or moisture, which may arise during the electrolytic plating process of the plated copper layer 308, along the fibers in the board.

Figure 4A:
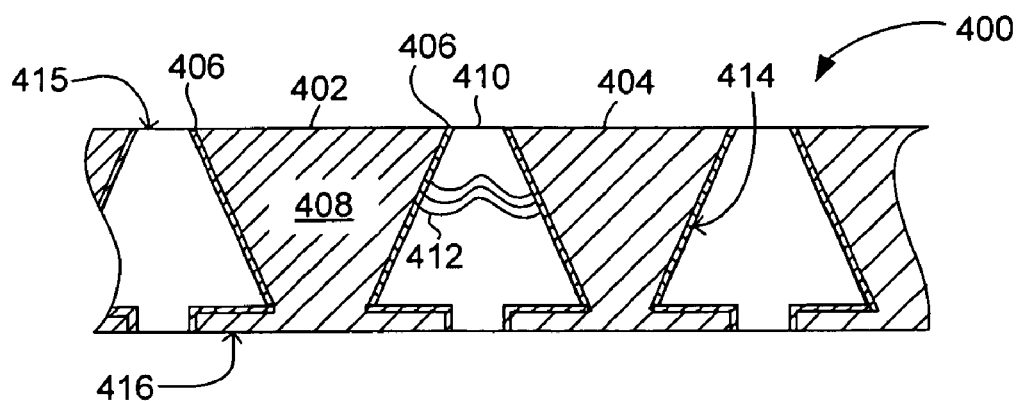
FIG. 4A is a side view of a portion of a PCB with conductive vias according to an embodiment.

FIG. 4A is a side view of a portion of a PCB 400 with conductive vias ("blind vias") 402, 404 according to an embodiment. For purposes of discussion, the term "through hole" is used herein to describe the hole made in the fiber-matrix board, e.g., by mechanical drilling or laser drilling, that is plated to form a plated through hole, or filled to form a conductive via. The wall of the through hole that exposes the fiber ends is called the sidewall of the through hole.

The conductive via 402 has a sputtered copper layer 406 underlying an electrolytic plated copper plug 408. As described above, the sputtered copper layer 406 forms a barrier against ionic intrusion along fibers 412 in the fiber-matrix board material 410 and provides a conductive surface for subsequent electrolytic plating. Using electrolytic copper plating, instead of electroless copper plating, reduces the exposure of the PCB to ions that could form CAFs.

The sidewall of the conductive via 404 has a sloping portion 414, which promotes more uniform deposition of the sputtered copper layer 406, compared to forming a sputtered layer on a vertical sidewall (compare, FIG. 3A). In a particular embodiment, the sidewall slopes at an angle between about thirty degrees and about sixty degrees, as measured relative to a major (planar) surface 415 of the board.

Copper is sputtered on the opposite side 416 of the PCB 400 to form a seed layer for plating copper on both sides 415, 416 of the PCB. In a particular embodiment, the PCB 400 is about thirty microns thick. The relatively thin board and sloping sidewalls result in a relatively uniform sputtered copper layer. In a particular embodiment, the sputtered copper layer 406 is about one micron to about two microns thick. The sputtered copper layer is thicker in alternative embodiments.

Figure 4B:
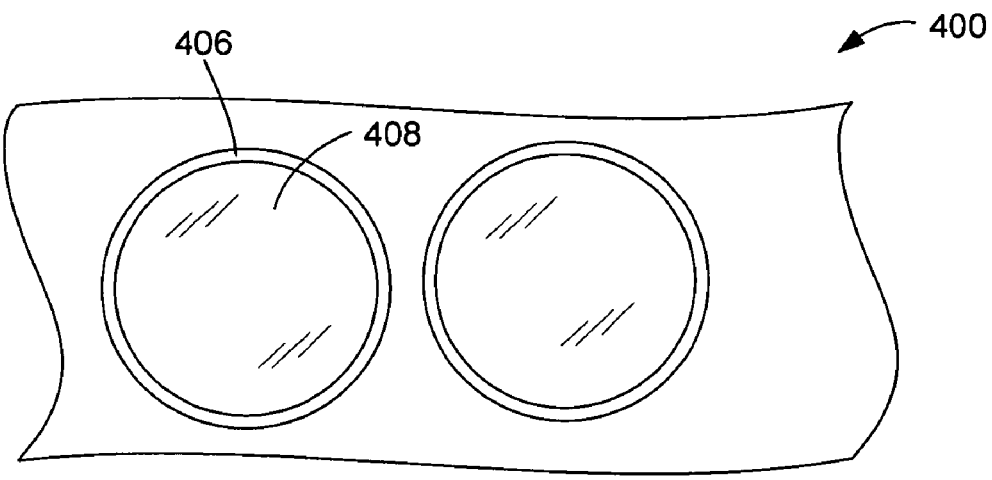
FIG. 4B is a plan view of the portion of the PCB illustrated in FIG. 4A.

FIG. 4B is a plan view of the portion of the PCB 400 illustrated in FIG. 4A. The copper plug 408 and sputtered copper barrier/seed layer 406 are seen on-end.

Figure 4C:
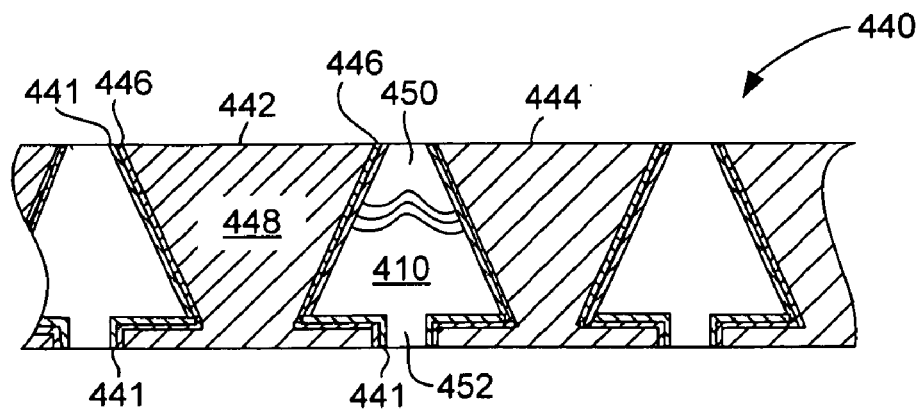
FIG. 4C is a side view of a portion of a PCB with conductive vias according to another embodiment.

FIG. 4C is a side view of a portion of a PCB 440 with conductive vias 442, 444 according to an alternative embodiment. A dielectric barrier layer 441 is formed on the sidewall of the via hole and a sputtered copper layer 446 is formed on the dielectric barrier layer 441. Electrolytic copper plating is used to fill the conductive via, forming a copper plug 448. Including the dielectric barrier layer 441 provides enhanced resistance to CAF formation, which is particularly desirable where thin sections 450, 452 of the fiber-matrix board 410 occur, such as in fine-pitch applications. In a particular embodiment, the sections of fiber-matrix board separating the conductive vias is much less than the center-to-center spacing (see, e.g., FIG. 4B), and such thin sections in conventional PCBs are particularly susceptible to CAF formation. Including the dielectric barrier layer 441 allows greater process and material flexibility, as described above in reference to FIG. 3C. The sloped sidewalls of the vias allow dielectric barrier layers to be formed by methods such as sputtering or deposition, as well as dipping. The dielectric barrier layer is not limited to thermosetting polymer materials.

FIG. 5 is a side view of an assembly 500 of an IC 502 on a PCB 504 according to an embodiment. In a particular embodiment, the PCB 504 is a package substrate and the IC 502 is a field-programmable gate array ("FPGA"). FPGAs have large numbers of pins, often arranged in a ball-grid array or bump array (e.g., C4 bump array) 506. The PCB 504 has through holes or blind vias with a sputtered copper layer. Further embodiments include an electrolytic plated layer or conductive plug. Embodiments of the invention are particularly desirable when interfacing with FPGAs because of the close spacing between pins on the PCB used to match the pin array on the FPGA, which might otherwise result in CAF failures.

FIG. 6A is a process of manufacturing a PCB 600 according to an embodiment. The PCB is a fiber-matrix board. Holes are formed in the PCB (602), such as by mechanical or laser drilling, that expose ends of fibers in the board at the sidewalls of the holes. If mechanical drilling is performed, a de-smearing step 604 is often used after drilling. A sputtered copper layer is deposited on the sidewalls of the holes (step 606). In a particular embodiment, copper is sputtered from both sides of the board, either sequentially or concurrently. In a particular embodiment, the sputtered copper layer is at least about one micron thick at its thinnest point. The sputtered copper layer is sufficiently thick to form a seed layer for electrolytic plating; however, in some embodiments, the sputtered copper layer is sufficiently thick such that plating is not required.

In a further embodiment, electrolytic copper is plated on the sputtered copper layer on the sidewalls of the holes (step 608). In one embodiment, the plated copper forms a plated through hole. In an alternative embodiment, the plated copper forms a conductive plug in a conductive via.

FIG. 6B is a process of manufacturing a PCB 620 according to an embodiment. The PCB is a fiber-matrix board. Holes are formed in the PCB (622), such as by mechanical or laser drilling, that expose ends of fibers in the board at the sidewalls of the holes. If mechanical drilling is performed, a de-smearing step is often used after drilling. A dielectric barrier layer is formed on the sidewalls of the holes (step 624). In a particular embodiment, the dielectric barrier layer formation included dipping the drilled board into a liquid resin polymer base, such as an epoxy. A sputtered copper layer is deposited on the sidewalls of the holes (step 626). In a particular embodiment, copper is sputtered from both sides of the board, either sequentially or concurrently. In a particular embodiment, the sputtered copper layer is at least about one micron thick at its thinnest point. The sputtered copper layer is sufficiently thick to form a seed layer for electrolytic plating; however, in some embodiments, the sputtered copper layer is sufficiently thick such that plating is not required.

In a further embodiment, electrolytic copper is plated on the sputtered copper layer on the sidewalls of the holes (step 628). In one embodiment, the plated copper forms a plated through hole. In an alternative embodiment, the plated copper forms a conductive plug in a conductive via.

What is claimed is:
1. A circuit board comprising:
a board having fibers dispersed in a polymer matrix;
a through hole in the board;
a dielectric layer disposed on and in contact with a sidewall of the through hole, wherein the dielectric layer is one of an epoxy or polyimide;
a sputtered copper layer disposed on and in contact with the dielectric layer within the through hole forming a sufficiently conductive layer for electrolytic plating over the sputtered copper layer;
wherein the sputtered copper layer has a first thickness near a planar surface of the board and a second thickness in a middle of the plated through hole less than the first thickness; and
an electrolytic copper layer disposed on and in contact with the sputtered copper layer;
wherein the electrolytic copper forms a plated through hole.

2. The circuit board of claim 1 wherein the sputtered copper layer is disposed on a sidewall of the through hole.

3. The circuit board of claim 1 wherein the sputtered copper layer is at least one micron thick.

4. The circuit board of claim 1 wherein the second thickness is at least one micron.

5. The circuit board of claim 1 wherein the electrolytic copper forms a copper plug in a conductive via.

6. The circuit board of claim 1 wherein a sidewall of the through hole includes a sloped portion.

7. The circuit board of claim 6 wherein the sloped portion is sloped at an angle between thirty degrees and sixty degrees relative to a major surface of the board.

8. The circuit board of claim 1 further comprising an integrated circuit mounted on the board.

9. The circuit board of claim 8 wherein the integrated circuit is a field-programmable gate array.

10. The circuit board of claim 9 wherein a pin of the field-programmable gate array is electrically connected to the sputtered copper layer.

11. A method of manufacturing a printed circuit board ("PCB") comprising:
drilling a hole in a fiber-matrix board so as to expose a fiber end of a fiber at a sidewall of the hole;
forming a dielectric layer on and in contact with a sidewall of the hole, the dielectric layer being one of epoxy or polyimide;
sputtering copper within the hole on and in contact with the dielectric layer so as to form a sputtered copper layer sufficiently conductive for electrolytic plating over the sputtered copper layer and to form the sputtered copper layer having a first thickness near a planar surface of the board and a second thickness in a middle of the plated through hole less than the first thickness; and
plating copper over and in contact with the sputtered copper layer within the hole using an electrolytic plating technique and forming a plated through hole with the electrolytic copper.

12. The method of claim 11 further comprising a step, prior to sputtering, of forming a dielectric barrier layer on the sidewall of the hole.

13. The method of claim 11 wherein the copper is sputtered onto the sidewall of the hole sufficiently thick to form a barrier layer against ionic migration along the fiber.

14. The method of claim 11 wherein the plating step fills the hole to form a conductive plug.

15. The method of claim 11 wherein sputtering includes sputtering from a first side of the board and from a second side of the board.

* * * * *